United States Patent
Perzlmaier et al.

(10) Patent No.: US 10,263,155 B2
(45) Date of Patent: Apr. 16, 2019

(54) METHOD FOR PRODUCING AN OPTOELECTRONIC COMPONENT

(71) Applicant: OSRAM Opto Semiconductors GmbH, Regensburg (DE)

(72) Inventors: Korbinian Perzlmaier, Regensburg (DE); Anna Kasprzak-Zablocka, Donaustauf (DE); Christian Leirer, Regensburg (DE)

(73) Assignee: OSRAM Opto Semiconductors GmbH, Regensburg (DE)

(*) Notice: Subject to any disclaimer, the term of this patent is extended or adjusted under 35 U.S.C. 154(b) by 0 days.

(21) Appl. No.: 15/756,935

(22) PCT Filed: Aug. 31, 2016

(86) PCT No.: PCT/EP2016/070525
§ 371 (c)(1),
(2) Date: Mar. 1, 2018

(87) PCT Pub. No.: WO2017/037121
PCT Pub. Date: Mar. 9, 2017

(65) Prior Publication Data
US 2018/0254383 A1    Sep. 6, 2018

(30) Foreign Application Priority Data

Sep. 1, 2015   (DE) .................. 10 2015 114 590

(51) Int. Cl.
*H01L 21/00*    (2006.01)
*H01L 33/38*    (2010.01)
(Continued)

(52) U.S. Cl.
CPC ........ *H01L 33/382* (2013.01); *H01L 33/0079* (2013.01); *H01L 33/22* (2013.01);
(Continued)

(58) Field of Classification Search
None
See application file for complete search history.

(56) References Cited

U.S. PATENT DOCUMENTS 4,489,101 A * 12/1984 Shibata ............... H01L 21/0272
                                                           204/192.32
7,223,645 B2 * 5/2007 Makiyama .......... H01L 21/0274
                                                           257/E21.205
(Continued)

FOREIGN PATENT DOCUMENTS

DE   102011016302 A1   10/2012
EP      2797125 A1      10/2014
(Continued)

*Primary Examiner* — Angel Roman
(74) *Attorney, Agent, or Firm* — Slater Matsil, LLP

(57) ABSTRACT

A method for producing an optoelectronic component is disclosed. In an embodiment the method includes a metallization with first mask structures is deposited directionally, and then a first passivation material is deposited non-directionally onto the metallization. Further, cutouts are introduced into the semiconductor body, such that the cutouts extend right into an n-type semiconductor region, and a second passivation material is applied on side faces of the cutouts. Furthermore, an n-type contact material is applied, structured and passivated. Moreover, contact structures are arranged on the semiconductor body and electrically connected to the n-type contact material and the metallization, wherein the contact structures and the semiconductor body are covered with a potting.

14 Claims, 7 Drawing Sheets

(51) Int. Cl.
  *H01L 33/00* (2010.01)
  *H01L 33/44* (2010.01)
  *H01L 33/50* (2010.01)
  *H01L 33/54* (2010.01)
  *H01L 33/62* (2010.01)
  *H01L 33/22* (2010.01)
  *H01L 33/30* (2010.01)
  *H01L 33/32* (2010.01)
  *H01L 33/40* (2010.01)

(52) U.S. Cl.
  CPC ............ *H01L 33/387* (2013.01); *H01L 33/44* (2013.01); *H01L 33/505* (2013.01); *H01L 33/54* (2013.01); *H01L 33/62* (2013.01); *H01L 33/30* (2013.01); *H01L 33/32* (2013.01); *H01L 33/40* (2013.01); *H01L 2933/005* (2013.01); *H01L 2933/0016* (2013.01); *H01L 2933/0025* (2013.01); *H01L 2933/0033* (2013.01); *H01L 2933/0041* (2013.01); *H01L 2933/0066* (2013.01)

(56) References Cited

U.S. PATENT DOCUMENTS

| | | | |
|---|---|---|---|
| 7,709,310 B2 * | 5/2010 | Markiyama | H01L 21/0274 257/E21.205 |
| 7,795,144 B2 | 9/2010 | Hirao | |
| 8,614,455 B2 | 12/2013 | Obata et al. | |
| 9,490,390 B2 | 11/2016 | Yoneda et al. | |
| 9,530,950 B2 | 12/2016 | Yoneda et al. | |
| 9,634,193 B2 | 4/2017 | Chae et al. | |
| 9,741,912 B2 | 8/2017 | Hoeppel | |
| 2003/0180633 A1 * | 9/2003 | Sato | G03F 7/0035 430/5 |
| 2005/0029625 A1 * | 2/2005 | Hussain | H01L 29/41708 257/565 |
| 2012/0074441 A1 | 3/2012 | Seo et al. | |
| 2013/0264592 A1 | 10/2013 | Bergmann et al. | |
| 2017/0352785 A1 * | 12/2017 | Lee | H01L 33/36 |

FOREIGN PATENT DOCUMENTS

| | | |
|---|---|---|
| JP | H10321913 A | 12/1998 |
| JP | 2007207981 A | 8/2007 |
| JP | 2008305874 A | 12/2008 |
| JP | 2010028100 A | 2/2010 |
| JP | 2012142401 A | 7/2012 |
| JP | 2012212871 A | 11/2012 |
| JP | 2012238823 A | 12/2012 |
| JP | 2013055164 A | 3/2013 |
| JP | 2014179590 A | 9/2014 |
| JP | 2014527313 A | 10/2014 |
| JP | 2015095617 A | 5/2015 |
| WO | 2012039555 A2 | 3/2012 |
| WO | 2014174400 A1 | 10/2014 |

* cited by examiner

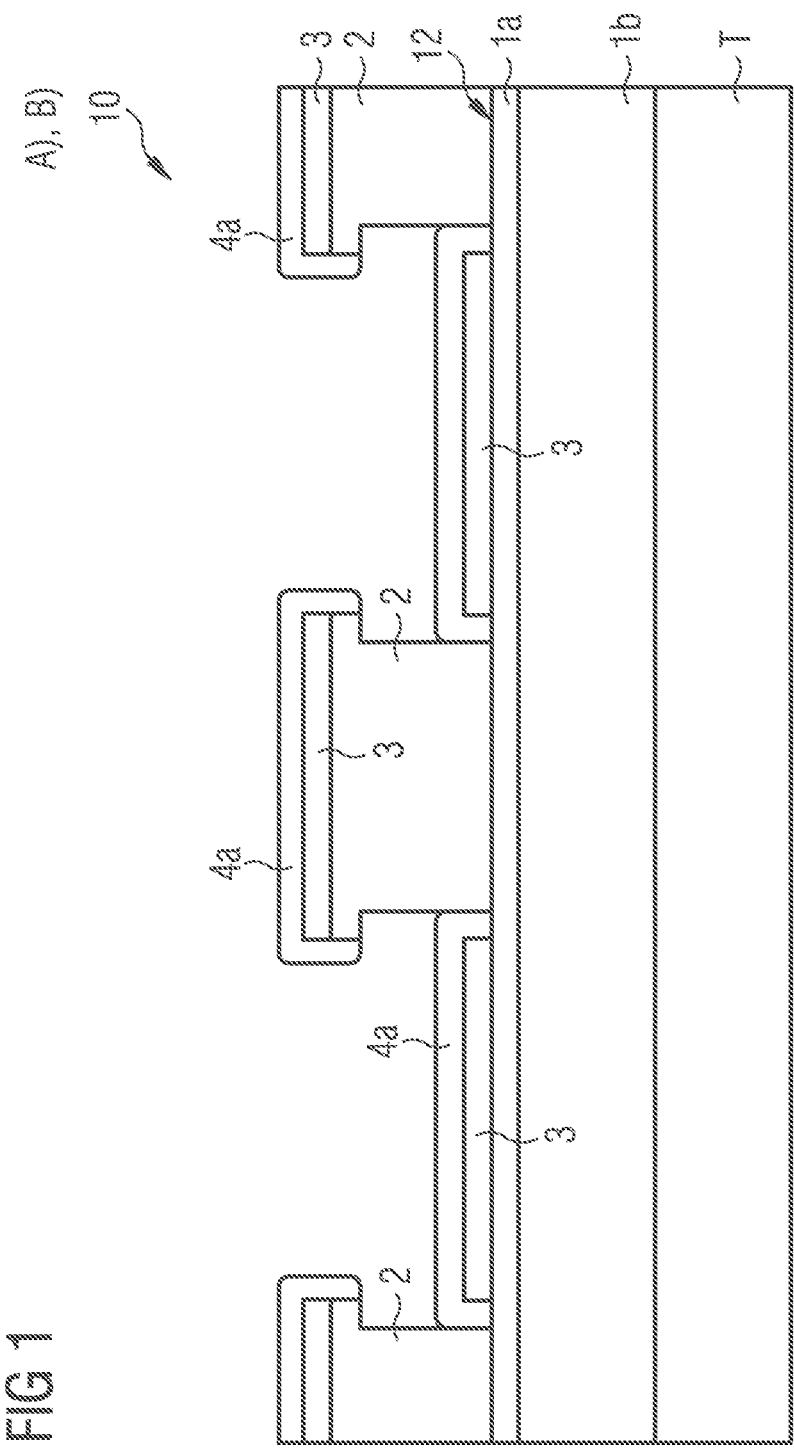

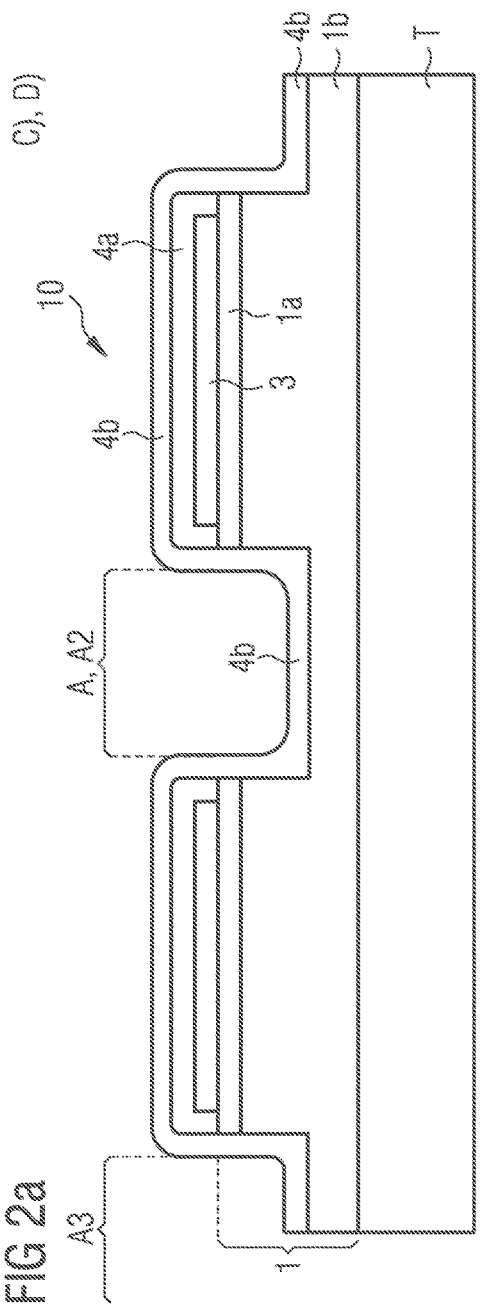
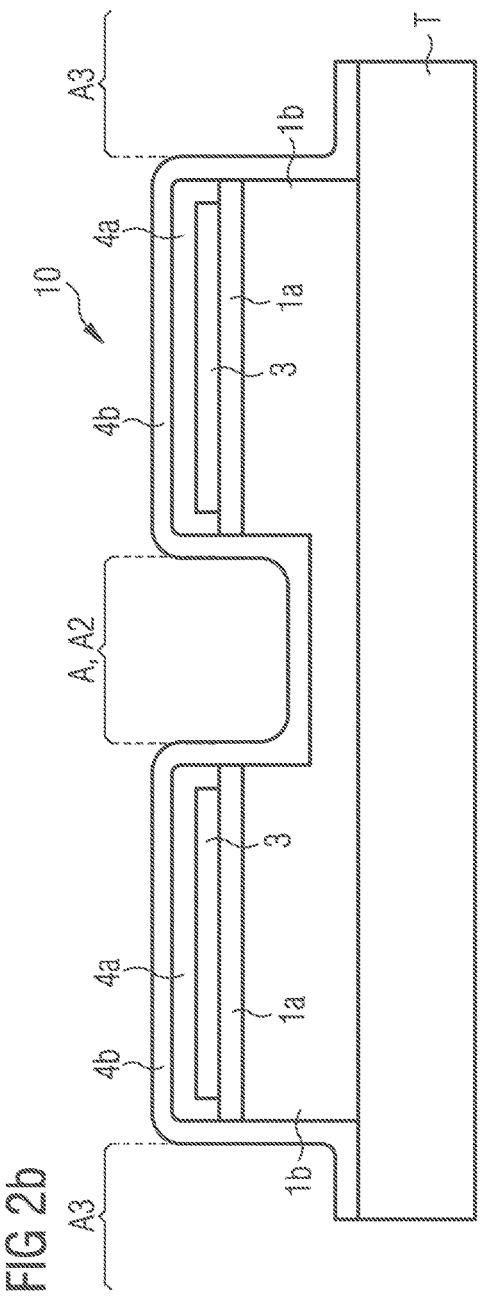

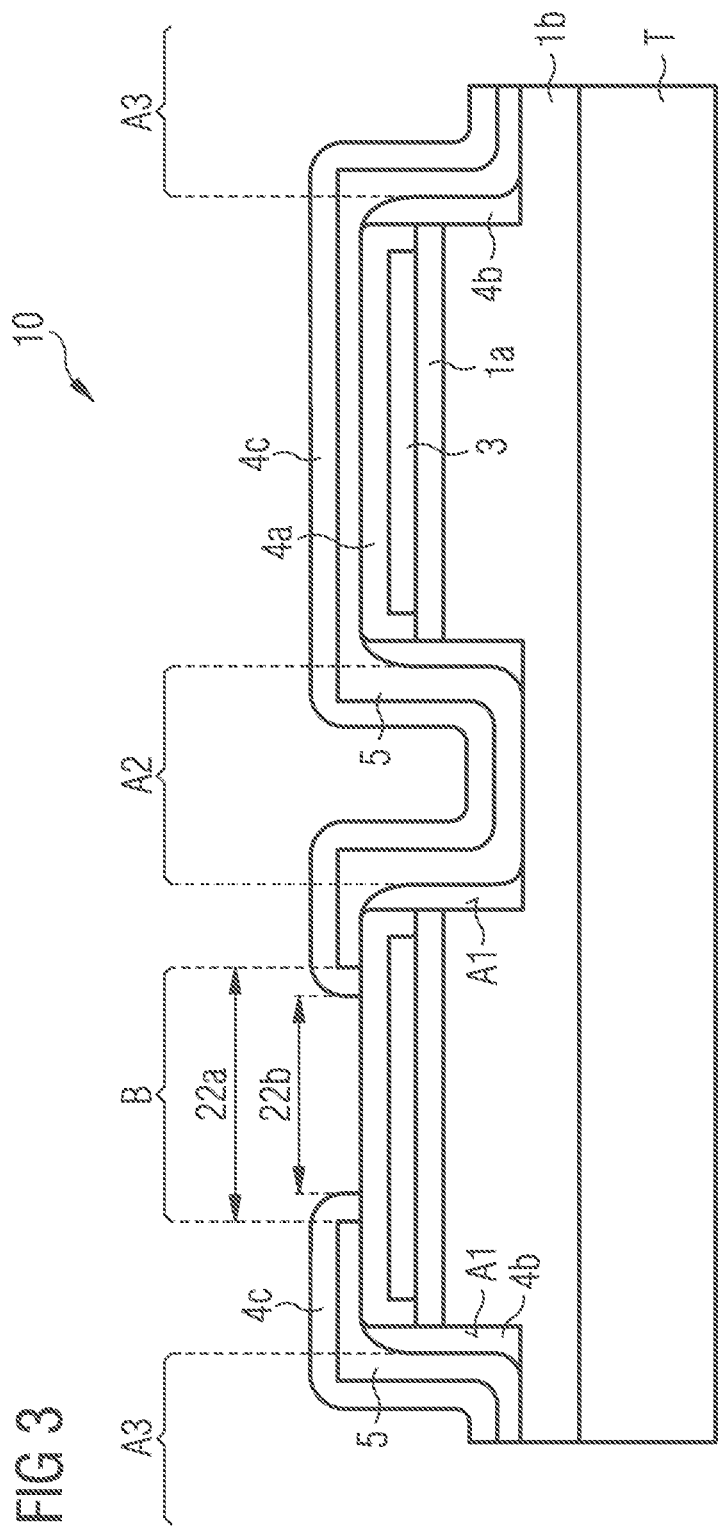

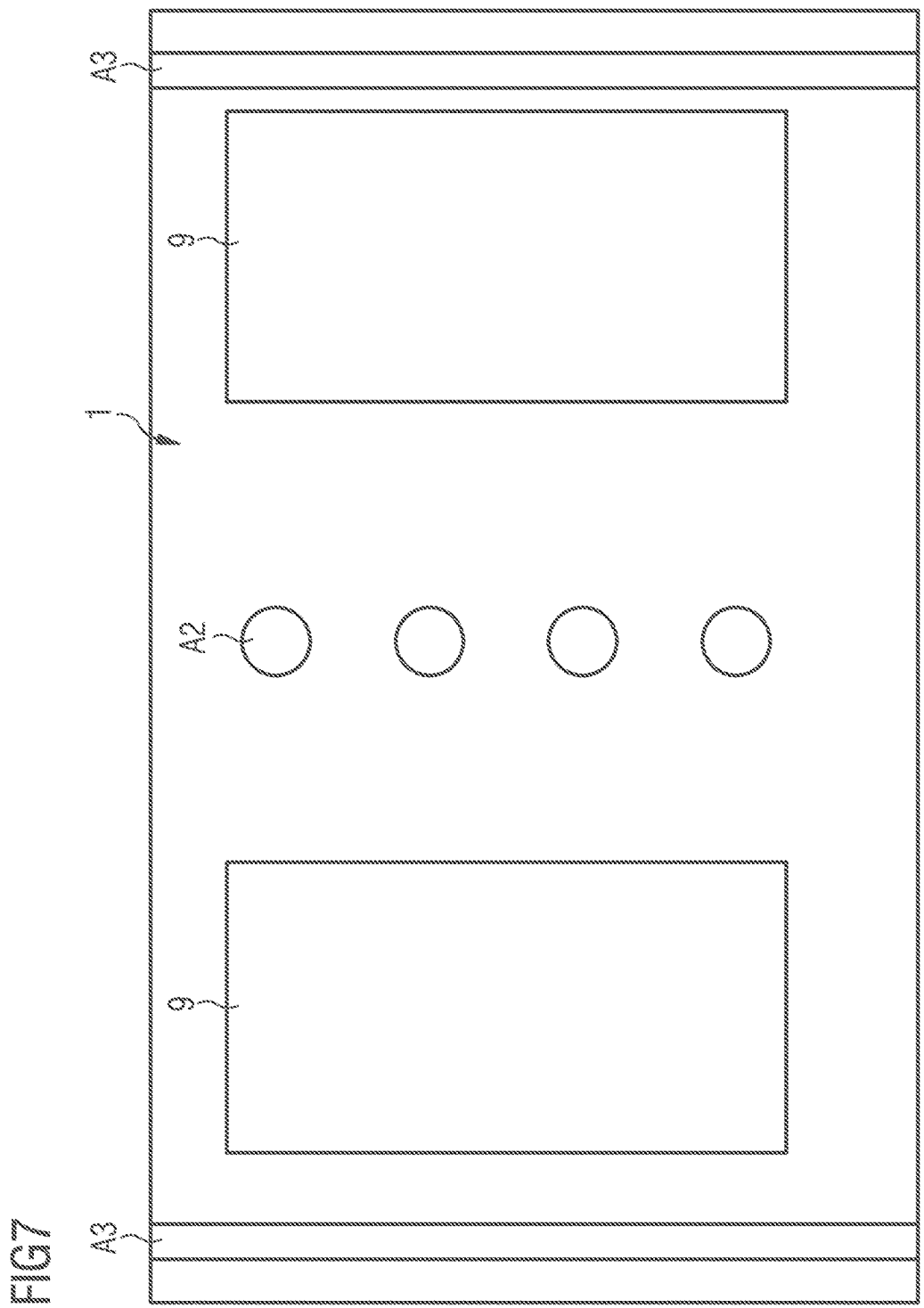

METHOD FOR PRODUCING AN OPTOELECTRONIC COMPONENT

This patent application is a national phase filing under section 371 of PCT/EP2016/070525, filed Aug. 31, 2016, which claims the priority of German patent application 10 2015 114 590.1, filed Sep. 1, 2015, each of which is incorporated herein by reference in its entirety.

TECHNICAL FIELD

The invention relates to a method for producing an optoelectronic component.

SUMMARY OF THE INVENTION

Embodiments provide a method for producing an optoelectronic component with a reduced number of lithographic steps.

Embodiments provide an optoelectronic component comprises providing a semiconductor body comprising a p-type semiconductor region and an n-type semiconductor region.

A p-type and an n-type semiconductor region can be grown epitaxially on a carrier, for example. The carrier can comprise a growth substrate, for example, and an n-type semiconductor region, an active zone and a p-type semiconductor region can be grown on the carrier in this order. The semiconductor regions can preferably be based on a III-V compound semiconductor material, in particular on an arsenide, nitride or phosphide compound semiconductor material. For example, the semiconductor regions can contain $In_xAl_yGa_{1-x-y}N$, $In_xAl_yGa_{1-x-y}P$ or $In_xAl_yGa_{1-x-y}As$, each with $0 \leq x \leq 1$, $0 \leq y \leq 1$ and $x+y \leq 1$. The III-V compound semiconductor material in this case does not necessarily have to have a mathematically exact composition according to one of the above formulae. Instead, it can comprise one or more dopants and additional constituents which do not substantially modify the physical properties of the material. For the sake of simplicity, however, the above formulae only contain the essential constituents of the crystal lattice although these can be partly replaced by small quantities of other substances. Furthermore, it is possible that at least one buffer layer is arranged between the semiconductor regions.

In various embodiments, the method comprises a directional deposition of a metallization on the p-type semiconductor region using first mask structures, the first mask structures being wider in shape on a side facing away from the semiconductor body than on a side facing towards the semiconductor body, and a subsequent non-directional deposition of a first passivating material on the metallization.

In various further embodiments, the first mask structures are arranged on the p-type semiconductor region in a patterned manner on a side of the p-type semiconductor region facing away from the carrier. In this case, the mask structures advantageously have a T-shape wherein, in a view of the p-type semiconductor region from directly above, the mask structures can be seen from their wide side. By means of, e.g., a PVD method, the metallization is advantageously deposited over the entire top side of the p-type semiconductor region and of the mask structures, advantageously by means of evaporation. The deposition of the metallization advantageously takes place in a directional deposition process. In other words, the mask structures cast a shadow for the evaporation method so that, after the evaporation, the metallization is not present on a region of the p-type semiconductor region which lies in the shadow cast by the mask structures.

The metallization may be reflective.

In yet further embodiments, the deposition of the passivating material takes place in a non-directional method. A casting of a shadow by the mask structures plays no part here and the passivating material is also deposited in the regions of the p-type semiconductor region in which no metallization was deposited. Suitable non-directional methods are, e.g., sputtering or evaporation using a scattering gas or CVD. However, non-directional methods can differ in their mode of operation in that some non-directional methods can also have a partly directional action. A partly directional action is distinguished, e.g., by the fact that, although no shadow effect is caused by the mask structures in a non-directional method, the material to be deposited is not, however, deposited on the vertical inner walls of the mask structures. In a completely non-directional method, the material to be deposited would also be deposited on the inner walls of the mask structures. A method of this type is, e.g., ALD (atomic layer deposition). Using an ALD method, even grooves can advantageously be overmolded.

The passivating material may serve the purpose of electrically insulating the metallization and acts as a hardmask for a subsequent erosion process, in particular an etching process. Since the first passivating material already acts as a hardmask, there is no need for a masking step in the method overall.

In other embodiments the method further comprises stripping the first mask structures and introducing recesses into the semiconductor body such that the recesses extend into the n-type semiconductor region.

The mask structures may be removed from the p-type semiconductor region in a lift-off process. Furthermore, in regions that are not covered by the metallization or the passivating material, the material of the p-type semiconductor region, the active zone and advantageously of part of the n-type semiconductor region is eroded so that recesses are obtained which extend from a side of the semiconductor body facing away from the carrier into the n-type semiconductor region thereof. The erosion takes place, e.g., by a dry etching process. The inside of the recess continues into the semiconductor body along side faces of the first passivating material perpendicularly to the top side of the semiconductor body. On the side of the semiconductor body facing towards the carrier, an n-contact layer can advantageously also be arranged, into which the recess extends through the n-type semiconductor region. The method steps are distinguished by high accuracy of the evaporation and of the formation of recesses. Tolerances in the evaporation of layers and formation of recesses can advantageously be reduced. Consequently, the area available for contacts, chip structures, contact surfaces and reflective surfaces can be better utilized.

In yet other embodiments the method comprises depositing a second passivating material on side faces of the recesses such that the second passivating material also covers a side face of the first passivating material.

The deposition of the second passivating material may take place by a non-directional method to ensure that the second passivating material covers all surfaces of the semiconductor body which face away from the carrier. Next, an intermediate step takes place in which the second passivating material is removed from the bottom of the recesses and from the top side of the regions of the semiconductor body that were obtained by the formation of the recesses. As a result, the second passivating material then advantageously remains only on the side faces of the recesses. In this way, a passivation of the semiconductor body advantageously takes place on the side faces thereof without employing a lithographic process.

Furthermore, the method may comprise a flat directional deposition of an n-contact material in the recesses and on the first passivating material using a second mask structure on the first passivating material, said mask structure being wider in shape on a side facing away from the semiconductor body than on a side facing towards the semiconductor body, and a subsequent flat non-directional deposition of a third passivating material on the n-contact material.

In other words, an electrically conductive material is advantageously deposited on the side of the semiconductor body facing away from the carrier over the entire surface with the aid of a directional method. On a first region of the semiconductor body, which was obtained by the formation of recesses, a second mask structure is arranged in this case. The second mask structure is arranged on the first passivating material which was exposed in the preceding method step by removing the second passivating material. A shadow cast in a process for depositing an electrically conductive material on the semiconductor body from a perpendicular direction results in a region around the second mask structure in which no electrically conductive material is deposited. Next, a non-directional deposition of a third passivating material takes place on the n-contact material. Since the electrically conductive material is in direct contact with the n-type semiconductor region, the electrically conductive material is referred to as an n-contact material.

In various additional embodiments the method further comprises a stripping of the second mask structure. In one embodiment of the method, a flat deposition of a first growth material takes place on the first passivating material and the third passivating material.

The first growth material can comprise, e.g., titanium-gold, chromium-gold or titanium-copper.

The second mask structure is advantageously stripped by means of a lift-off method. After the deposition, the first growth material advantageously covers the entire top side of the semiconductor body facing away from the carrier in a flat manner and also extends into the recesses.

One embodiment of the method comprises a directional erosion of the first growth material using third mask structures and then an erosion of the third passivating material and of the first passivating material in a region, the third mask structures being wider in shape on a side facing away from the semiconductor body than on a side facing towards the semiconductor body, wherein [in] a region in which the first passivating material is not covered by the third passivating material the first growth material is also not covered by the third mask structures.

On the layer composed of the first growth material, third mask structures may be arranged. The third mask structures themselves advantageously have recesses, which are located above the regions of the semiconductor body in which no recesses were introduced into the semiconductor body. The third mask structures advantageously have a thickness of more than 100 μm. A recess in the third mask structures is advantageously located within the region in which the second mask structure was arranged on the semiconductor body. First, in a directional process, the first growth material is removed, advantageously etched, within the recesses of the third mask structures such that, owing to a shadow cast from a direction perpendicular to the semiconductor body, a residue of the first growth material remains around the third mask structures. The first growth material here is advantageously eroded down to the underlying passivating materials. Next, in a directional process, the underlying passivating materials are removed in the recesses of the third mask structures, again as a result of the casting of a shadow.

The method may further comprise depositing contact structures between the third mask structures and stripping the third mask structures and the first growth material as well as encapsulating the contact structures and covering the semiconductor body with a potting.

Within the recesses of the third mask structures, contact structures are introduced. In the region of the semiconductor body in which the second mask structure was stripped, the first passivating material is eroded and the contact structure is joined to the metallization, forming a p-contact. In the recess of the third mask structures on another region of the semiconductor body, the third passivating material is eroded and the n-contact material is exposed. Next, the contact structure is joined to the n-contact material and an n-contact is formed.

Next, the semiconductor body may be encapsulated with a potting on a side facing away from the carrier.

According to at least one embodiment of the method, the potting is deposited on the contact structures and the semiconductor body and then the contact structures are exposed on a side facing away from the semiconductor body and a contact metallization is deposited on the exposed sides of each of the contact structures. The potting is advantageously eroded until the contact structures are exposed, e.g., by a grinding process. The contact metallizations advantageously form contacting sites as a p-contact and an n-contact, which are advantageously arranged in a flat manner on the surface of the potting, which face away from the carrier of the semiconductor body.

According to at least one embodiment of the method, the contact metallizations differ from one another in their shape.

In order to be able to distinguish the p-contact and the n-contact from one another, the contact metallizations are formed with different shapes. Any shapes are advantageously possible here.

According to at least one embodiment of the method, the first mask structures and/or the second mask structure and/or the third mask structures comprise(s) a lacquer material.

A lacquer material, advantageously a photoresist or a laminated dry film resist, is advantageously well suited to deposition processes and etching processes using masking methods. The lacquer is advantageously easy to deposit, to pattern and to erode again afterwards.

According to at least one embodiment of the method, the recesses comprise a first type and a second type, the second type being in the form of an isolating trench.

A recess of a first type is advantageously located in the inner region of the semiconductor body at a distance from the edge region of the semiconductor body and can advantageously be formed as a circular recess. In a region B, one or more p-contacts can be formed during the method which are in contact with the p-type semiconductor region of the semiconductor body, and in the other regions of the semiconductor body one or more n-contacts can be formed during the method which are in contact with the n-type semiconductor region in recess[es] of the first type by way of the n-contact material. In the region B, the second mask structure was arranged in a preceding method step. The second-type recesses advantageously terminate the component externally.

According to at least one embodiment of the method, the p-type semiconductor region and the n-type semiconductor region are removed completely in the second type of recesses.

In other words, the n-type semiconductor region is not removed completely in the first-type recess. In second-type recesses, which delimit the semiconductor body externally, the p-type semiconductor region and the n-type semiconductor region can advantageously be removed completely, so that in these recesses semiconductor materials are removed down to the carrier of the semiconductor body. This is advantageously the case in the isolating trenches. The removal of the p-type semiconductor region and of the n-type semiconductor region advantageously takes place during or immediately after method step C). The removal can advantageously take place by means of an etching method, wherein the first passivating material can act as a hardmask for the etching process. The semiconductor body can therefore be severed completely in the isolating trenches and a further material, e.g., a non-transparent material, can advantageously be deposited on the side faces of the semiconductor body in the isolating trenches. As a result of the non-transparent material, a lateral emission of blue light by the semiconductor body can advantageously be reduced or prevented.

According to at least one embodiment of the method, a second growth material is deposited in a flat and non-directional manner between the third mask structures.

The second growth material then advantageously covers the bottom of the recesses between the third mask structures and extends on to a top side of the first growth material, the top side being covered within the recess. The second growth material advantageously covers the first growth material in those regions in which the first growth material was not removed owing to the shadow cast by the third mask structures. In this way, a complete coverage of the bottoms of the recesses by the second growth material takes place between the third mask structures. The deposition of the second growth material can advantageously take place in a non-directional manner, since the aim is to deposit the second growth material advantageously on all surfaces of the semiconductor body between the third mask structures. A coverage of the insides of the recesses in the third mask structures advantageously does not take place.

According to at least one embodiment of the method, the contact structures are formed on the second growth material between the third mask structures by electroplating.

The contact structures can comprise, e.g., Ni, Cu, Pd, Au, Sn, Pt, Al or Ag.

In a simultaneous production process of the contact structures, these are first formed to different heights in the recesses, since the bottoms of the recesses can have different depths. The height difference in the bottoms of the recesses for the contact structures or the height difference in the contact structures after they have been formed is advantageously small relative to the height of the contact structures and is, e.g., 10 μm, the height of the contact structures being, e.g., 100 μm.

According to at least one embodiment of the method, the stripping of all mask structures takes place by means of an etching method.

It is advantageously possible to perform all stripping processes in the method by an etching method. Furthermore, stripping is also possible by means of ashing or by means of a film, which is deposited on the mask structures and peeled off again together with the mask structures.

According to at least one embodiment of the method, the semiconductor body is provided on a growth substrate in a wafer composite.

The semiconductor body can be formed on a growth substrate in this way, advantageously grown epitaxially.

Method steps A) to H) can advantageously all take place at wafer level and multiple optoelectronic components can be produced simultaneously and singulated, e.g., by means of sawing or laser cutting. The method for producing a plurality of optoelectronic components is distinguished by a small number of lithographic and masking steps.

According to at least one embodiment of the method, the growth substrate is stripped from the semiconductor body. After the stripping of the growth substrate, the hardened potting advantageously acts as a supporting element.

According to at least one embodiment of the method, a converter material is deposited on a side of the semiconductor body facing away from the contact structures.

To influence the emission properties of the components, or of the semiconductor body, a converter material can advantageously be deposited. It is furthermore possible to deposit a scattering element or other optical elements on the semiconductor body or to arrange them after said semiconductor body. It is advantageously also possible, after a removal of the growth substrate, to roughen a radiation exit side of the semiconductor body, advantageously the side of the semiconductor body facing away from the contact structures.

According to at least one embodiment of the method, a protective layer is deposited on the p-type semiconductor region of the semiconductor body.

As a result thereof, stripping methods such as the use of a plasma can be used. After the first mask structure has been stripped, the semiconductor body can be post-treated, e.g., with a plasma to remove residues of the mask structures. The protective layer must be stripped again before method step C).

According to at least one embodiment of the method, the first passivating material and/or the second passivating material and/or the third passivating material comprise(s) a dielectric material.

Dielectric materials, such as $SiO_x$, e.g., $SiO_2$, $SiN_x$, $TiO_x$ or $Al_xO_y$, e.g., $Al_2O_3$, are well suited to non-directional deposition on the semiconductor body and to acting as an electrical insulator or as a protective layer against external influences such as moisture and as a hardmask for further lithographic processes. It is not necessary to use a separate mask structure in this case and the number of lithographic processes during the method for producing optoelectronic components can be reduced.

BRIEF DESCRIPTION OF THE DRAWINGS

Further advantages, advantageous embodiments and developments can be taken from the exemplary embodiment described below in conjunction with the figures.

FIG. 1, FIGS. 2a to 2b, FIG. 3, FIG. 4, FIG. 5 and FIGS. 6 to 6a show the optoelectronic component during the production process in a schematic side view; and FIG. 7 shows the optoelectronic component in a top view.

Identical elements or elements having the same effect are in each case provided with the same reference signs in the figures. The components illustrated in the figures and the size ratios to one another of the components should not be considered as being to scale.

DETAILED DESCRIPTION OF ILLUSTRATIVE EMBODIMENTS

Figure 4:
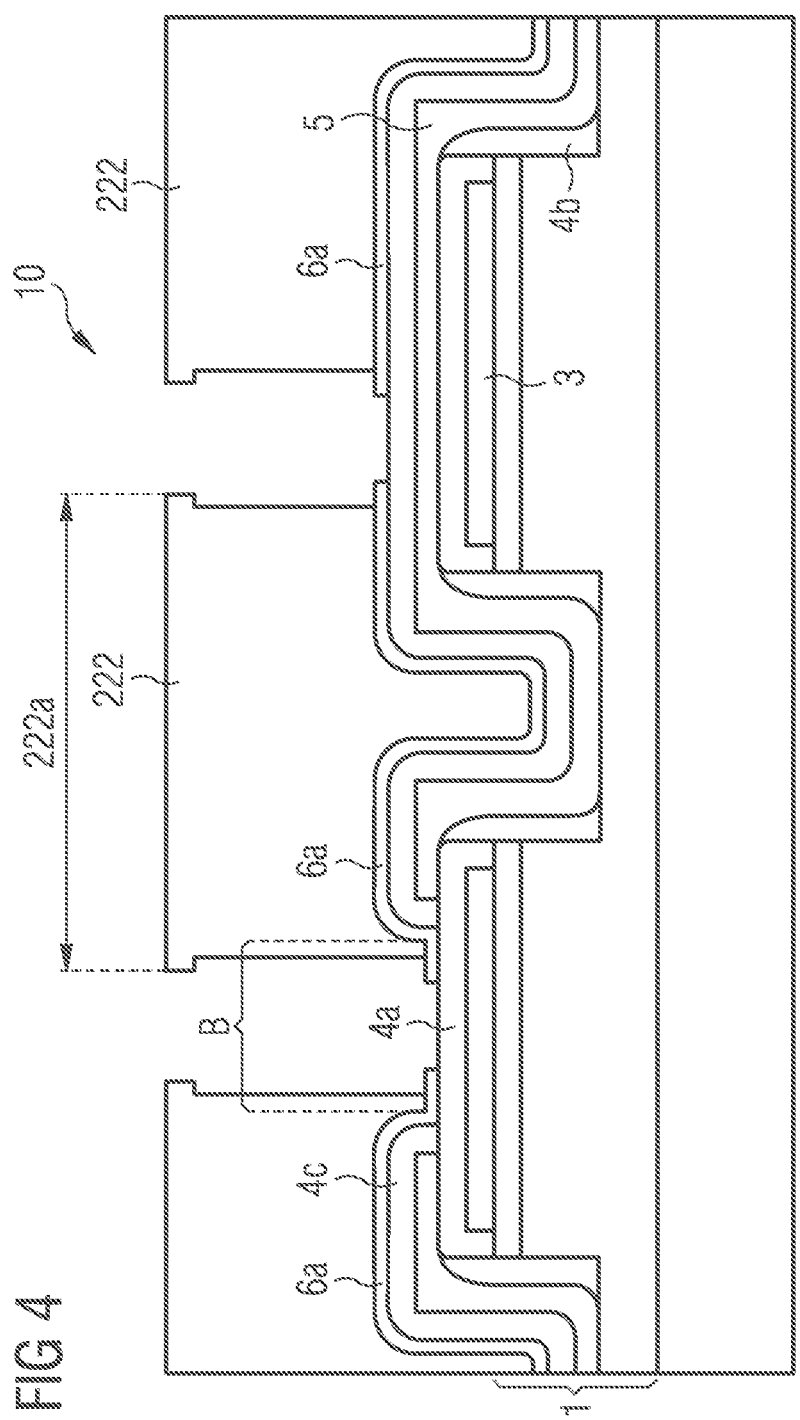

FIG. 1 shows the optoelectronic component 10 during the production process after method steps A) and B). On a carrier T, a semiconductor body 1 comprising a p-type semiconductor region 1a and an n-type semiconductor region 1b is arranged, wherein an active zone can be arranged between the p-type semiconductor region 1a and the n-type semiconductor region 1b. In a method step B), first mask structures 2 are advantageously arranged, composed of, e.g., a lacquer material, the first mask structures 2 being wider in shape on a side 2a facing away from the semiconductor body 1 than on a side 2b facing towards the semiconductor body 1. In a top view looking directly down on to the top side of the semiconductor body 1, a shadow is cast by the first mask structures so that, in a directional deposition method, regions of the semiconductor body 1 which lie within the cast shadow are not covered by a metallization 3. By means of a deposition method the metallization 3 is arranged on the top side of the semiconductor body, and therefore on the mask structures 3 and between these, except within the cast shadow. In a directional deposition method, the metallization 3 can also extend partly into the cast shadow as a result of the accuracy of the deposition method. Advantageously, the metallization 3 can extend into the cast shadow by a range corresponding to one to five times the thickness of the deposited metallization 3. Alternatively, the metallization 3 can extend into the cast shadow by a range corresponding to 1/10 to 1/3 of the height of the mask structures 2.

Furthermore, it is possible to deposit a protective layer 12 on to the p-type semiconductor region 1a before arranging the mask structures 2. The protective layer 12 can advantageously comprise an oxide. Owing to the protective layer 12, the semiconductor body 1 can advantageously be post-treated with a further process step after the first mask structures 2 have been stripped to ensure that all residues of the mask structures in the openings have been removed. For the post-treatment, e.g., a plasma method can be employed. Alternatively, instead of the further process step for the post-treatment, it is possible to strip the first mask structures using only a plasma method.

In method step B), furthermore, a first passivating material 4a is deposited on the metallization 3 on the semiconductor body 1 in a non-directional deposition method, in particular on the mask structures 2 and between the mask structures. As a result of the non-directional method, the regions of the semiconductor body within the cast shadow are also covered by the first passivating material 4a.

FIG. 2a shows the optoelectronic component 10 in a schematic side view after method step C) and after a sub-step of method step D). In method step C), the first mask structures are stripped from the semiconductor body 1. In the region where the first mask structures have been stripped, advantageously no passivating material and no metallization are present on the semiconductor body 1. According to FIG. 1, however, it is possible that a protective layer is present on the semiconductor body 1. In the other regions, in a subsequent method for eroding the p-type semiconductor region is and part of the n-type semiconductor region 1b, the first passivating material 4a acts as a mask, which is not completely eroded during the erosion method, advantageously an etching process. When a protective layer is used as in FIG. 1, the protective layer must be advantageously completely removed before the erosion of the p-type semiconductor region is and the n-type semiconductor region 1b. The protective layer is advantageously jointly removed in the same process step by one of the stripping methods applied, advantageously etched.

In this way, recesses A, A2, A3 are advantageously introduced into the semiconductor body 1 down into the n-type semiconductor region 1b. By using the first passivating material 4a as a mask, it is advantageously possible to omit a further masking step.

In a first sub-step of method step D), a second passivating material 4b is deposited in a flat and non-directional manner over the entire top side of the semiconductor body. After its deposition, the second passivating material 4b covers the side faces A1 and the bottom of the recesses A, A2, A3 as well as the first passivating material 4a. The first passivating material 4a and the second passivating material 4b can advantageously be dielectric materials. The second passivating material 4b advantageously covers the top side and the recesses of the semiconductor body completely.

A first type of recess A2 is arranged within the semiconductor body 1 and a second type of recess A3 advantageously delimits the component 10 externally.

FIG. 2b shows the optoelectronic component 10 in a schematic side view as in FIG. 2a, the optoelectronic component 10 of FIG. 2b differing in that, in the second-type recesses A3 which delimit the component 10 externally, the p-type semiconductor region is and the n-type semiconductor region 1b are removed completely. After the p-type semiconductor region is and the n-type semiconductor region 1b have been removed completely, the carrier T, advantageously the growth substrate of the semiconductor body 1, is exposed in the second-type recesses A3. Furthermore, it is possible that below the n-type semiconductor region 1b and/or below the p-type semiconductor region is a buffer layer is present, which is not removed completely. In the first-type recess A2, a residue of the n-type semiconductor region 1b remains with a residual thickness of the n-type semiconductor region 1b and the carrier T is not exposed. As a result of exposing the carrier T in the outer second-type recesses A3, the semiconductor body 1 is severed completely in the isolating trenches. Advantageously, a further material, e.g., a non-transparent material, can be deposited on the side faces of the semiconductor body 1 in the isolating trenches. As a result of the non-transparent material, a lateral emission of blue light by the semiconductor body 1 can advantageously be reduced or prevented.

To simplify the production, the first-type recesses A2 and the second-type recesses A3 can advantageously be introduced into the semiconductor body by the same method.

FIG. 3 shows the optoelectronic component 10 from FIG. 2a or FIG. 2b wherein, in a second sub-step of method step D), the second passivating material 4b is removed from the bottom of the recesses A, A2, A3 and from the top side of the semiconductor body 1. As a result, the second passivating material 4b advantageously then remains only on the side faces A1 of the first- and second-type recesses A2, A3.

FIG. 3 shows the region B of the semiconductor body 1 on which a second mask structure 22 has been arranged and stripped off, the second mask structure 22 being wider in shape on a side 22a facing away from the semiconductor body 1 than on a side 22b facing towards the semiconductor body 1 (in FIG. 3, only the widths of the second mask structure are shown). In method step E), a directional deposition of an n-contact material 5 takes place in the first- and second-type recesses A2, A3 and on the first passivating material 4a, which also covers the side faces A1 of the recesses. Next, a flat, non-directional deposition of a third passivating material 4c takes place on to the n-contact material 5. As a result of a shadow cast by the second mask structure 22, after the directional deposition of an n-contact material 5 a region with the width 22a remains, in which no n-contact material 5 is arranged. After a non-directional deposition of the third passivating material 4c, this covers the top side of the semiconductor body 1 in a flat manner in the first- and second-type recesses A2 and A3 and on the semiconductor body 1, a region with the width 22*b* remaining free from the third passivating material 4*c* within the region B as a result of the second mask structure. The width 22*b* here is smaller than the width 22*a*. FIG. 3 shows the component 10 after the second mask structure 22 has been stripped off again (method step F).

FIG. 4 shows the optoelectronic component 10 from FIG. 3 after a further method step F1).

A first growth material 6*a* is deposited on the top side of the semiconductor body 1 in a flat manner such that the first growth material 6*a* covers the third passivating material 4*c*, and in the region B1 within the region B, which is free from third passivating material 4*c*, the first growth material 6*a* covers the first passivating material 4*a*.

In a method step F2), third mask structures 222 are arranged on the semiconductor body 1 such that in the region B of the semiconductor body 1, in which the second mask structure was arranged on the semiconductor body, no coverage of the first growth material 6*a* by the third mask structures 222 takes place. Furthermore, a part of the semiconductor body 1 outside the region B is also not covered by the third mask structures 222. The third mask structures 222 have a greater width on a side 222*a* facing away from the semiconductor body 1 than on a side 222*b* facing towards the semiconductor body 1.

In a further step, in a directional method the first growth material 6*a* is removed, advantageously etched, within the recesses of the third mask structures such that, as a result of a shadow cast from a direction perpendicular to the semiconductor body 1, a residue of the first growth material 6*a* remains around the third mask structures. Alternatively, it is also possible that the first growth material 6*a* is removed completely within the recesses of the third mask structures in a non-directional method. This takes place, e.g., by ashing.

Figure 5:
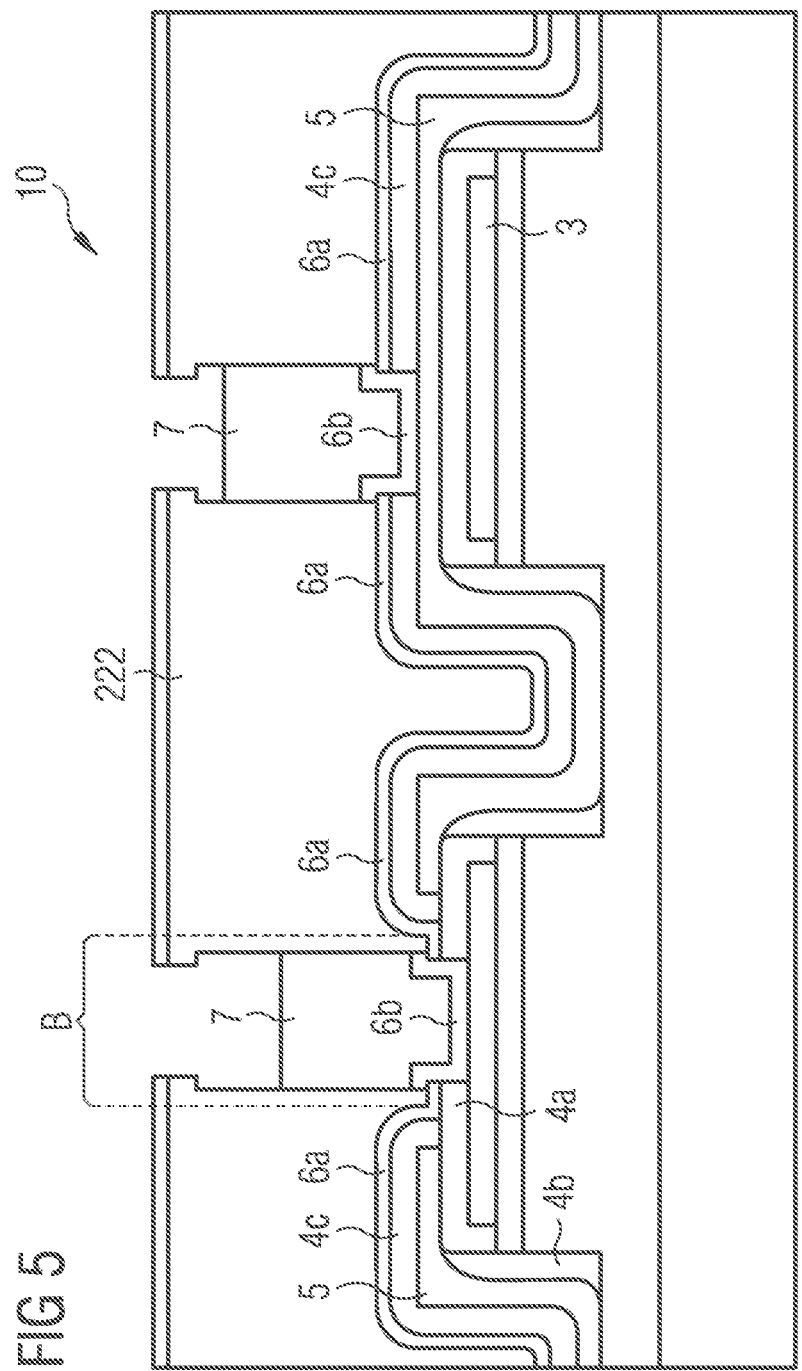

FIG. 5 shows the optoelectronic component 10 from FIG. 4 after further method steps. After the first growth material 6*a* has been removed between the third mask structures 222 by a non-directional erosion method, [in] a further step the first passivating material 4*a* is eroded between the third mask structures 222 in the region B and the third passivating material 4*c* is eroded between the third mask structures 222 in the remaining region of the semiconductor body. This advantageously exposes the metallization 3 in the region B and the re-contact materials in the remaining recesses of the third mask structures 222. The passivating materials 4*a* and 4*c* are eroded according to the shadow cast by the third mask structures 222 and, after the erosion, have a vertical side wall within the recesses between the third mask structures 222, which is flush with a vertical side wall of the first growth material 6*a*.

By means of the third mask structures 222, subsequently and before method step G), a second growth material 6*b* is deposited in the recesses of the third mask structures 222 in a non-directional method. The second growth material 6*b* then advantageously covers the bottom of the recesses between the third mask structures 222 and extends to a top side of the first growth material 6*a*, which results from the shadow cast for the deposition of the first growth material 6*a*. In this way, there is complete coverage of the bottoms of the recesses between the third mask structures by the second growth material 6*b*. As a result of the non-directional and flat deposition, the second growth material 6*b* is also present on the top side of the third mask structures 222.

In a method step G), contact structures 7 are formed on the second growth material 6*b* between the third mask structures 222, advantageously by electroplating. The growth materials 6*a* and 6*b* are advantageously electrically conductive. In a simultaneous production process of the contact structures 7, these are initially formed in the recesses between the third mask structures 222, wherein the recesses can have different depths.

Figure 6:
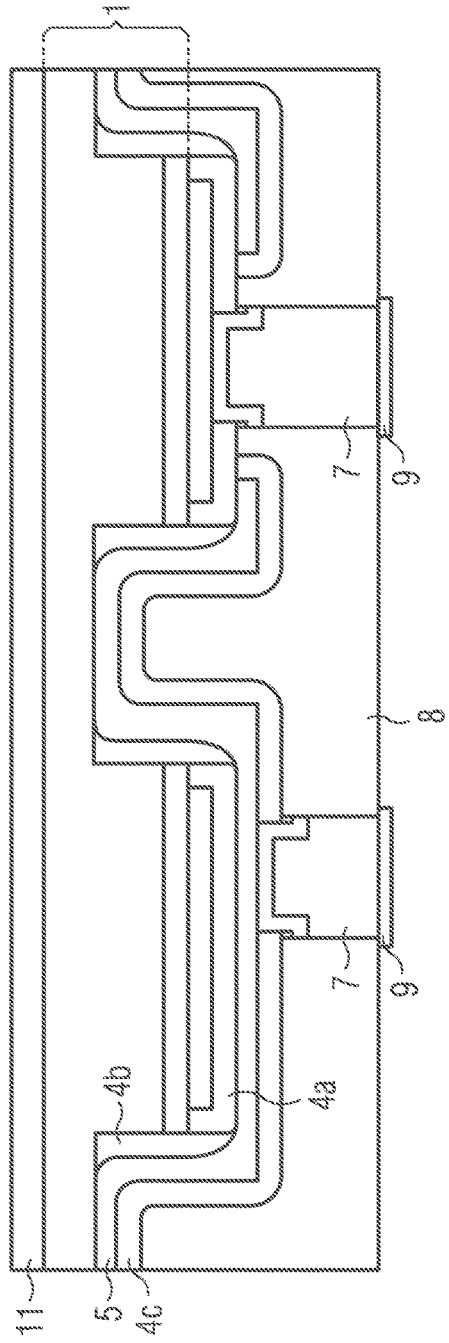

FIG. 6 shows the optoelectronic component 10 from FIG. 5 after method steps G1) and H) in a finished state. In a method step G1), the third mask structures 222 and the first growth material 6*a* are removed from the semiconductor body 1. The third mask structures can advantageously be stripped using a lift-off method and the first growth material 6*a* can be removed, e.g., by an etching method. Only that region of the first growth material 6*a* which is covered by the second growth material 6*b* and by the contact structures 7 remains. The stripping methods are advantageously selective, since the contact structures are not stripped. Furthermore, stripping is also possible by means of ashing or by means of a film which is deposited on the mask structures 222 and peeled off again together with the mask structures.

In the subsequent method step H), the contact structures 7 are encapsulated with a potting 8 and the top side of the semiconductor body 1 is covered.

Furthermore, the carrier, which acts as a growth substrate for the semiconductor body, is advantageously stripped from the component 10 after encapsulation with the potting 8.

After the growth substrate has been stripped, the cured potting 8 advantageously acts as a supporting element.

In a further step, the potting is eroded from a side facing away from the semiconductor body 1, e.g., by grinding, until the contact structures 7 are freed from the potting 8 and exposed on a side facing away from the semiconductor body 1 on a level with the potting. Next, a contact metallization 9 is deposited on the exposed sides of the contact structures 7 and partly protruding over the potting 8. Alternatively, it is also possible that the contact structures 7 are encapsulated with a potting 8 such that the sides of the contact structures 7 facing away from the semiconductor body 1 are not covered by the potting 8. The contact structures 7 can advantageously be encapsulated with the potting 8 such that these are only laterally surrounded by the potting 8 and the potting only extends to the height of the lowest contact structure 7. The contact structures 7 extending beyond the potting 8 can be ground down to the height of the potting. Instead of grinding, however, the height difference can also be compensated using a solder material on the contact structures 7.

The contact structures 7 form p- and n-contacts of the component 10. The shape of the contact metallization 9 can differ according to whether it belongs to the n-contact or the p-contact. On the side of the semiconductor body 1 facing away from the potting 8, a converter material 11 is arranged on the semiconductor body 1 after the carrier has been stripped off.

The component 10 advantageously emits light from a side of the semiconductor body facing away from the contact structures 7.

Figure 6A:
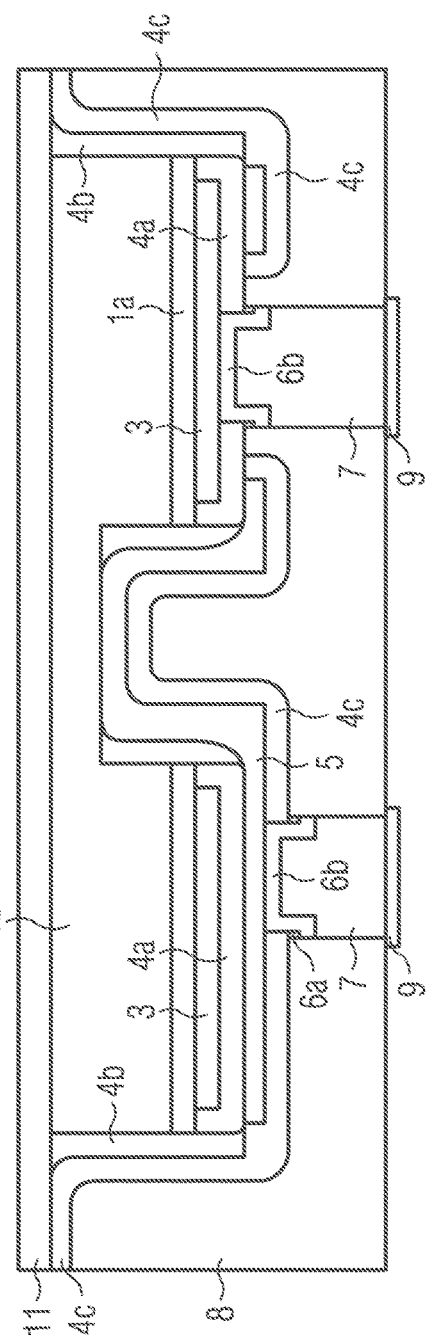

In one embodiment, in the second-type recesses A3, which delimit the component 10 externally, the semiconductor body can be removed down to the carrier (FIG. 2*b*). In the second-type recesses A3, the n-contact material 5 not extend to the carrier. In this case, the outsides of the semiconductor body 1 are surrounded by the second passivating material 4*b* down to the carrier, wherein at the edge of the component, around the second passivating material 4*b* in a lateral direction, the potting 8 with the third passivating material 4c extends to the carrier. This is shown in FIG. 6a. In FIG. 6a, the carrier is removed and the third passivating material 4c and the semiconductor body are in direct contact with the converter material 11, which terminates the component 10 in the emission direction. In this case, the converter material 11 extends beyond the semiconductor body 1 at the sides.

FIG. 11 shows a top view of the semiconductor body 1. A plurality of first-type recesses A2 are introduced into the semiconductor body 1 as circular recesses. Second-type recesses A3 delimit the semiconductor body 1 laterally. An arrangement of second-type recesses on all lateral sides is also possible. Contact metallizations 9 cover the contact structures as a p- or n-contact in each case, wherein a contact metallization[s] 9 can cover a plurality of contact structures.

The description with the aid of the exemplary embodiments does not limit the invention thereto. Rather, the invention comprises any new feature and any combination of features, which in particular includes any combination of features in the patent claims, even if this feature or this combination is not itself explicitly stated in the patent claims or exemplary embodiments.

The invention claimed is:

1. A method for producing an optoelectronic component, the method comprising:
    providing a semiconductor body having a p-type semiconductor region and an n-type semiconductor region;
    directionally depositing a metallization on the p-type semiconductor region using first mask structures, the first mask structures being wider in shape on a side facing away from the semiconductor body than on a side facing towards the semiconductor body;
    non-directionally depositing a first passivating material on the metallization;
    stripping the first mask structures;
    introducing recesses into the semiconductor body such that the recesses extend into the n-type semiconductor region;
    depositing a second passivating material on side faces of the recesses such that the second passivating material also covers a side face of the first passivating material;
    flat directionally depositing an n-contact material in the recesses and on the first passivating material using a second mask structure on the first passivating material, the second mask structure being wider in shape on a side facing away from the semiconductor body than on a side facing towards the semiconductor body;
    flat non-directionally depositing a third passivating material on the n-contact material;
    stripping the second mask structure;
    depositing contact structures on the semiconductor body and electrically connecting the contact structures to the n-contact material and the metallization, wherein each contact structure is only connected to the n-contact material or the metallization; and
    encapsulating the contact structures and covering the semiconductor body with a potting.

2. The method according to claim 1, further comprising:
    flat depositing a first growth material on the first passivating material and on the third passivating material;
    directionally eroding the first growth material using third mask structures, the third mask structures being wider in shape on a side facing away from the semiconductor body than on a side facing towards the semiconductor body;
    eroding the third passivating material and the first passivating material in a region, wherein in the region in which the first passivating material is not covered by the third passivating material, the first growth material is also not covered by the third mask structures; and
    stripping the third mask structures and the first growth material.

3. The method according to claim 2, wherein the contact structures are deposited between the third mask structures.

4. The method according to claim 3, wherein, after directional eroding the first growth material and before stripping the third mask structures, depositing a second growth material in a flat and non-directional manner between the third mask structures.

5. The method according to claim 4, wherein the contact structures are formed by electroplating on the second growth material between the third mask structures.

6. The method according to claim 1, further comprising:
    exposing the contact structures on a side facing away from the semiconductor body; and
    depositing a contact metallization on the exposed sides of each of the contact structures.

7. The method according to claim 6, wherein the contact metallizations differ from one another in their shape.

8. The method according to claim 1, wherein the recesses comprise a first type and a second type, and wherein the second type is an isolating trench.

9. The method according to claim 8, wherein the p-type semiconductor region and the n-type semiconductor region are completely removed in the second type of recesses.

10. The method according to claim 1, wherein the semiconductor body is provided on a growth substrate in a wafer composite.

11. The method according to claim 10, further comprising stripping the growth substrate from the semiconductor body after encapsulating the contact structures.

12. The method according to claim 1, further comprising depositing a converter material on a side of the semiconductor body facing away from the contact structures.

13. The method according to claim 1, further comprising depositing a protective layer on the p-type semiconductor region of the semiconductor body before directionally depositing the metallization.

14. The method according to claim 1, wherein the first passivating material, the second passivating material or the third passivating material comprises a dielectric material.

* * * * *